US012756396B2

(12) United States Patent
Bae

(10) Patent No.: US 12,756,396 B2
(45) Date of Patent: Oct. 6, 2026

(54) INVERTER AND BOOTSTRAP INVERTER HAVING IMPROVED OUTPUT CHARACTERISTICS

(71) Applicant: HOSEO UNIVERSITY ACADEMIC COOPERATION FOUNDATION, Asan-si (KR)

(72) Inventor: Byung Seong Bae, Asan-si (KR)

(73) Assignee: Hoseo University Academic Cooperation Foundation, Asan-si (KR)

( * ) Notice: Subject to any disclaimer, the term of this patent is extended or adjusted under 35 U.S.C. 154(b) by 68 days.

(21) Appl. No.: 18/845,333

(22) PCT Filed: Apr. 18, 2022

(86) PCT No.: PCT/KR2022/005509

§ 371 (c)(1),
(2) Date: Sep. 9, 2024

(87) PCT Pub. No.: WO2023/191169

PCT Pub. Date: Oct. 5, 2023

(65) Prior Publication Data

US 2025/0202488 A1 Jun. 19, 2025

(30) Foreign Application Priority Data

Mar. 30, 2022 (KR) ........................ 10-2022-0039900

(51) Int. Cl.
*H03K 19/20* (2006.01)
*H03K 19/017* (2006.01)

(52) U.S. Cl.
CPC ........... *H03K 19/20* (2013.01); *H03K 19/017* (2013.01); *H03K 19/01714* (2013.01)

(58) Field of Classification Search
CPC ................. H03K 19/20; H03K 19/017; H03K 19/01714; H03K 3/037; H03K 19/0948
See application file for complete search history.

(56) References Cited

U.S. PATENT DOCUMENTS 3,927,334 A * 12/1975 Callahan ................ H03K 5/023 327/295
4,587,447 A * 5/1986 Baehring ....... H03K 19/018507 326/88

FOREIGN PATENT DOCUMENTS

JP 2004-153577 A 5/2004
KR 10-1998-0067510 A 10/1998
KR 19980067510 A * 10/1998

(Continued)

*Primary Examiner* — Daniel D Chang
(74) *Attorney, Agent, or Firm* — You & IP, LLC

(57) ABSTRACT

The present invention relates to an inverter comprising: a first load transistor which has gate and drain electrodes connected to a power voltage (VDD) terminal; a second load transistor which has gate and drain electrodes connected to a source electrode of the first load transistor and has a source electrode connected to an output terminal; a driving transistor which has a drain electrode connected to the source electrode of the second load transistor to form the output terminal, has a gate electrode connected to an input (Vin) terminal, and has a source electrode connected to a ground (GND) terminal; and a control transistor which has a drain electrode connected to the source electrode of the first load transistor, has a gate electrode connected to the input (Vin) terminal, and has a source electrode connected to the ground (GND) terminal.

3 Claims, 10 Drawing Sheets

(56) References Cited

FOREIGN PATENT DOCUMENTS

| | | | |
|---|---|---|---|
| KR | 10-2009-0104362 | A | 10/2009 |
| KR | 10-2009-0131555 | A | 12/2009 |
| KR | 10-2012-0108894 | A | 10/2012 |
| KR | 10-1420967 | B1 | 7/2014 |

* cited by examiner

-Prior Art-

-Prior Art-

-Prior Art-

-Prior Art-

INVERTER AND BOOTSTRAP INVERTER HAVING IMPROVED OUTPUT CHARACTERISTICS

TECHNICAL FIELD

The present disclosure relates to an inverter and a bootstrap inverter. More particularly, the present disclosure relates to an inverter and a bootstrap inverter having improved output characteristics by applying a circuit in which a predetermined transistor is added.

BACKGROUND ART

A digital signal consists of only two values that are 0 and 1, an inverter produces an output of 1 for an input of 0, and the inverter produces an output of 0 for an input of 1. A truth table and symbols are as shown in [Table 1].

TABLE 1

| Input | Output |
|---|---|
| 0 | 1 |
| 1 | 0 |

A representative method of constructing an inverter is using a CMOS inverter that connects a transistor of a P-channel type and a transistor of an N-channel type to each other. FIG. 1 is a view illustrating a circuit diagram of a CMOS inverter.

FIG. 2 is a graph showing an input voltage and an output voltage when the input voltage of the inverter in FIG. 1 is increased from 0V to VDD that is a power voltage. In a situation in which the power voltage VDD is regarded as a digital signal '1' and 0V is corresponded to a digital signal '0', when the input is 0, a PMOSFET is turned on, an NMOSFET is turned off, and the output voltage becomes the VDD, so that the output becomes '1'. Conversely, in a state in which the input is '1', the input voltage is the VDD, the PMOSFET is turned off, the NMOSFET is turned on, and the output voltage becomes 0V, so that an output state becomes 'O'. Such a CMOS circuit is also formed of a thin film transistor, and may be formed by using a P-channel type thin film transistor and an N-channel type thin film transistor.

FIG. 3 is an example of an inverter formed of an N-channel Enhancement-type transistor. A Q2 transistor is referred to as a load transistor, and a Q1 transistor is referred to as a driving transistor. Referring to FIG. 3, the inverter may be formed by replacing the inverter of the N-channel with a resistor instead of the Q2 transistor. Since the resistor occupies a large area, the transistor with a minimum area is used so as to form the inverter. The inverter is a basic circuit constituting a logic circuit. When the power voltage VDD is in a state of 'l' and the input voltage 0V is in a state of '0', the inverter is required to be configured to output '0' when the input is '1', and to output '1' when the input is '0'. In FIG. 3, when a voltage of 0V is input to the input, the Q1 transistor is in a turned off state, and an output terminal is connected to the VDD through the Q2 transistor, so that the output is increased to the VDD voltage. However, when the output voltage is in a state in which the power voltage VDD is subtracted from a threshold voltage of the Q2 transistor, the Q2 transistor is in a turned off state, so that the output no longer increases and stops, so that the output voltage becomes VDD-Vth. A circuit that solves this problem is an inverter using a bootstrap.

FIG. 4 is a view illustrating a circuit diagram of a bootstrap inverter. Referring to FIG. 4, when an input voltage Vin becomes 0 and a T2 transistor is turned off, the output voltage starts to increase. At this time, a gate voltage of a T1 transistor increases simultaneously, and the gate voltage of the T1 transistor becomes higher than the VDD. Since the gate voltage of the T1 transistor becomes higher than a threshold voltage than the VDD, the output voltage becomes the VDD.

Referring to FIG. 3 again, when the input becomes VDD, the Q1 transistor is turned on, and the output voltage is lowered. Since an output node is a point where the Q2 transistor and the Q1 transistor are connected in series, the output voltage is determined by a resistance ratio of the Q2 transistor and the Q1 transistor. The output voltage may be expressed as [Relational expression 1].

$$Vout=VDD[R_{Q1}/(R_{Q1}+R_{Q2})] \quad \text{[Relational expression 1]}$$

Referring to [Relational equation 1], the smaller $R_{Q1}$ is and the larger Roz is, the closer the output voltage is to 0V. However, in a situation in which the Roz is large, when the output becomes the VDD, the output current flows through the Roz, so that there is a problem that the output current becomes small. In an inverter circuit that uses only the N-channel, when the output is zero, the voltage is required to be zero. However, since the output voltage is determined by the resistance ratio of the Q2 transistor and the Q1 transistor, a complete zero output is not realized. Therefore, a conventional inverter has a problem that an output voltage slightly higher than a complete 0V is generated.

Against this background, the present applicant has devised a circuit in which an output voltage of zero is completely realized when an output voltage of zero is output even in an inverter configured only with an N-channel transistor.

DOCUMENT OF RELATED ART

Patent Document

Korean Patent No. 10-1420967

DISCLOSURE

Technical Problem

The present disclosure is provided so as to solve a problem in which an output voltage becomes lower than VDD when an inverter logic outputs '1'. In addition, the present disclosure is provided so as to solve a problem in which an output voltage does not completely become 0V when an inverter logic outputs 'O'.

Technical Solution

In order to achieve the objectives described above, according to the present disclosure, there is provided an inverter including: a first load transistor having a gate electrode and a drain electrode that are connected to a power voltage (VDD) terminal; a second load transistor having a gate electrode and a drain electrode that are connected to a source electrode of the first load transistor, the second load transistor having a source electrode connected to an output terminal; a driving transistor having a drain electrode connected to the source electrode of the second load transistor such that the output terminal is formed, the driving transistor having a gate electrode connected to an input (Vin) terminal and having a source electrode connected to a ground (GND) terminal; and a control transistor having a drain electrode connected to the source electrode of the first load transistor, having a gate electrode connected to the input (Vin) terminal, and having a source electrode connected to the ground (GND) terminal.

Preferably, when the gate electrode of the control transistor is turned on, the source electrode of the first load transistor may be connected to the ground (GND) terminal, so that a voltage of a node (P) to which the drain electrode of the second load transistor connected to the output terminal and the source electrode of the first load transistor are connected may become 0V.

In addition, according to the present disclosure, there is provided a bootstrap inverter including: a first load transistor having a gate electrode and a drain electrode that are connected to a power voltage (VDD) terminal; a second load transistor having a drain electrode connected to a source electrode of the first load transistor and having a source electrode of the second load transistor connected to an output terminal; a bootstrap transistor having a gate electrode and a drain electrode that are connected to the power voltage (VDD) terminal and having a source electrode connected to a gate electrode of the second load transistor; a driving transistor having a drain electrode connected to the source electrode of the second load transistor such that the output terminal is formed, the driving transistor having a gate electrode connected to an input (Vin) terminal and having a source electrode connected to a ground (GND) terminal; and a control transistor having a drain electrode connected to the source electrode of the first load transistor, having a gate electrode connected to the input (Vin) terminal, and having a source electrode connected to the ground (GND) terminal.

Preferably, the bootstrap inverter may further include a capacitor having a first end connected to the source electrode of the bootstrap transistor and having a second end connected to the output terminal.

Advantageous Effects

According to the present disclosure, a problem in which a state of output 1 becomes less than VDD and a state of output 0 does not output complete 0V in an inverter configured only with an N-channel transistor may be solved, so that an inverter in which a state of output 1 is VDD and a state of output 0 is a complete 0V may be realized. According to the present disclosure, an inverter with improved output characteristics is provided.

MODE FOR INVENTION

Figure 1:
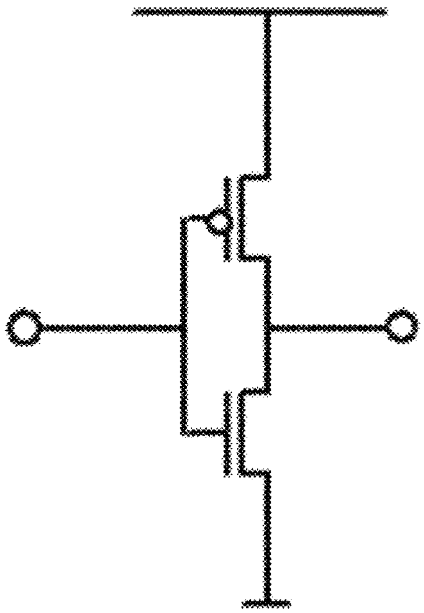
FIG. 1 is a view illustrating a circuit diagram of a CMOS inverter.
Figure 2:
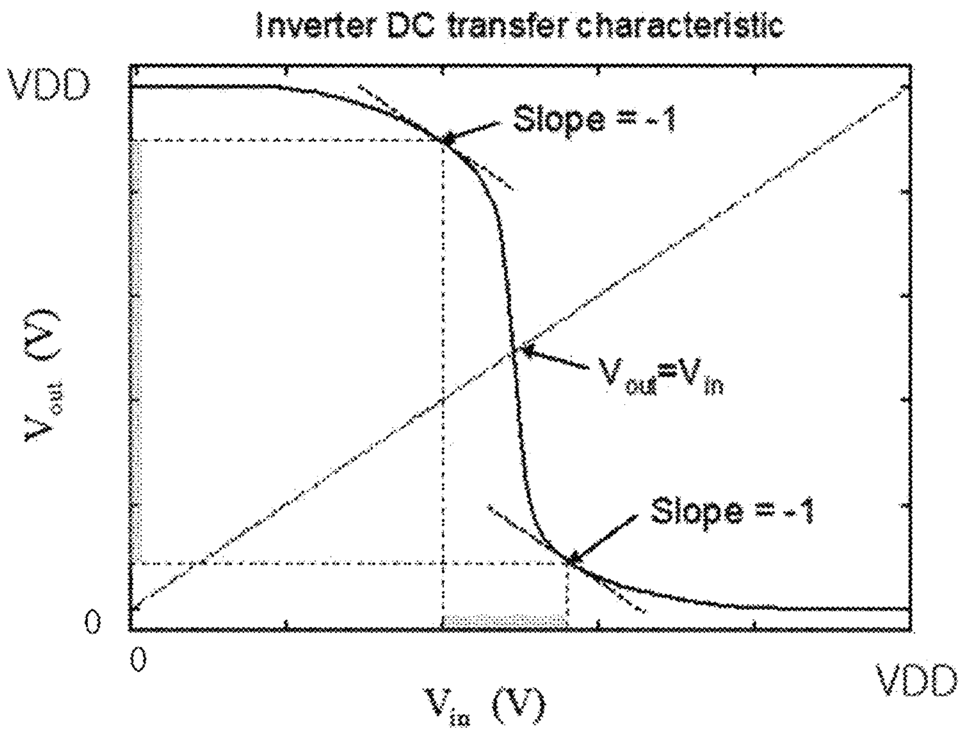
FIG. 2 is a graph showing an input voltage and an output voltage when the input voltage of the inverter in FIG. 1 is increased from 0V to VDD that is a power voltage.
Figure 3:
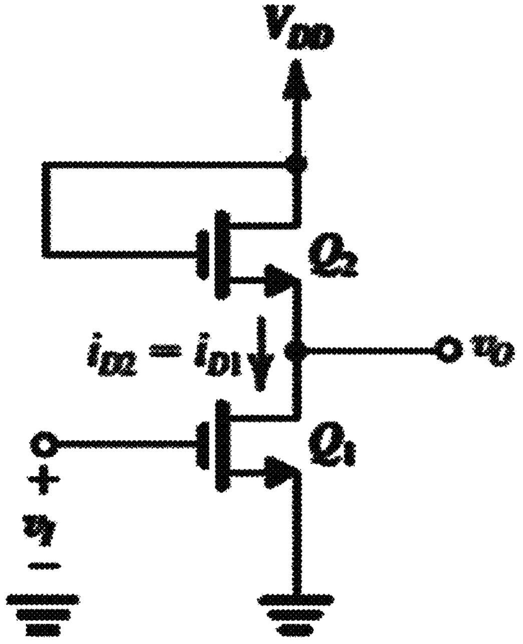
FIG. 3 is an example of an inverter formed of an N-channel Enhancement-type transistor.
Figure 4:
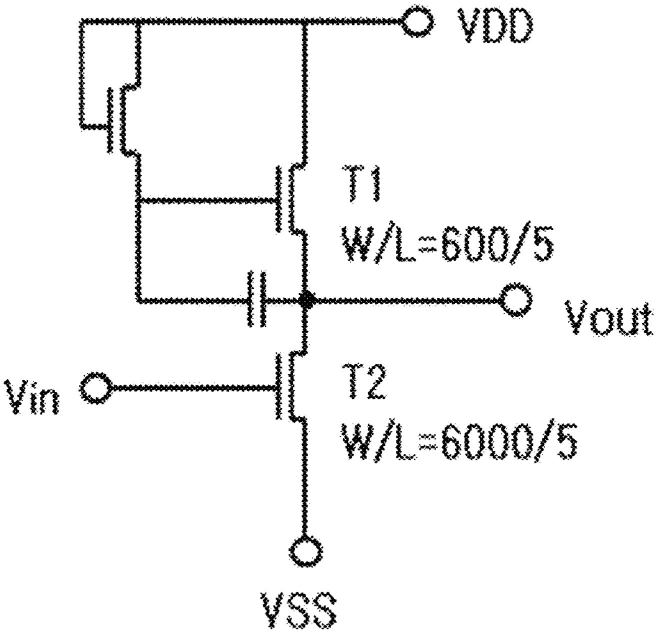
FIG. 4 is a view illustrating a circuit diagram of a bootstrap inverter.

Hereinafter, the present disclosure will be described in detail with reference to the contents described in the accompanying drawings. However, the present disclosure is not limited or restricted by exemplary embodiments. Same reference numerals presented in each drawing represent members that perform substantially the same function.

Objectives and effects of the present disclosure may be naturally understood or more clearly understood according to the following description, and the objectives and the effects of the present disclosure are not limited to the following description. In addition, in describing the present disclosure, when it is determined that a detailed description of a known technology related to the present disclosure may unnecessarily obscure the subject matter of the present disclosure, the detailed description will be omitted.

Figure 5:
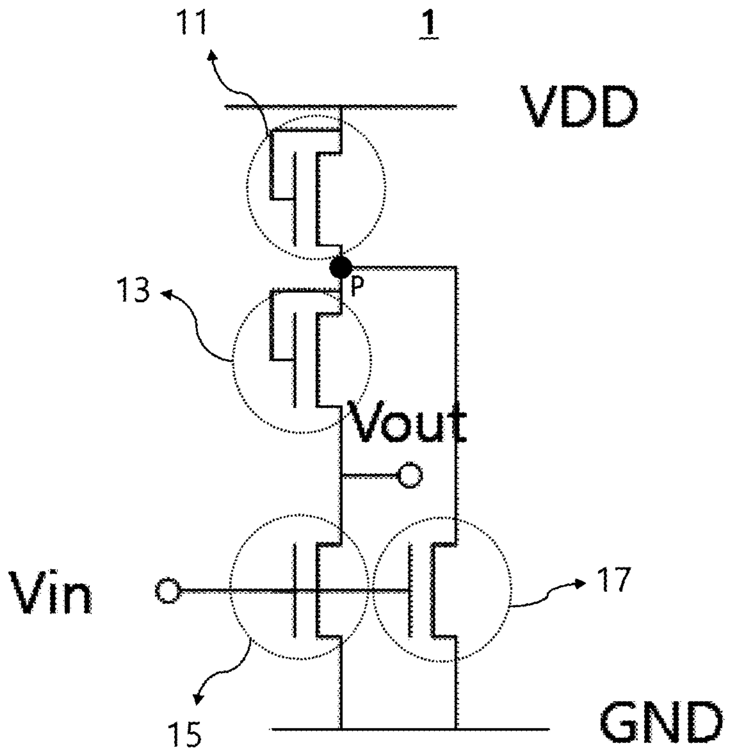
FIG. 5 is a view illustrating a circuit diagram of an inverter according to an embodiment of the present disclosure.

FIG. 5 is a view illustrating a circuit diagram of an inverter 1 according to an embodiment of the present disclosure.

Referring to FIG. 5, the inverter 1 according to the present embodiment may include a first load transistor 11, a second load transistor 13, a driving transistor 15, and a control transistor 17.

A gate electrode and a drain electrode of the first load transistor 11 are connected to a power voltage (VDD) terminal. A gate electrode and a drain electrode of the second load transistor 13 are connected to a source electrode of the first load transistor 11, and a source electrode of the second load transistor 13 is connected to an output terminal.

A drain electrode of the driving transistor 15 is connected to the source electrode of the second load transistor 13 such that the output terminal is formed, a gate electrode of the driving transistor 15 is connected to an input (Vin) terminal, and a source electrode of the driving transistor 15 is connected to a ground (GND) terminal.

A drain electrode of the control transistor 17 is connected to the source electrode of the first load transistor 11, a gate electrode of the control transistor 17 is connected to the input (Vin) terminal, and a source electrode of the control transistor 17 is connected to the ground (GND) terminal.

The control transistor 17 is configured such that the source electrode of the first load transistor 11 is connected to the ground (GND) terminal when the gate electrode of the control transistor 17 is turned on, so that a voltage of a node (P) to which the drain electrode of the second load transistor 13 connected to the output terminal and the source electrode of the first load transistor 11 are connected becomes 0V.

Figure 6:
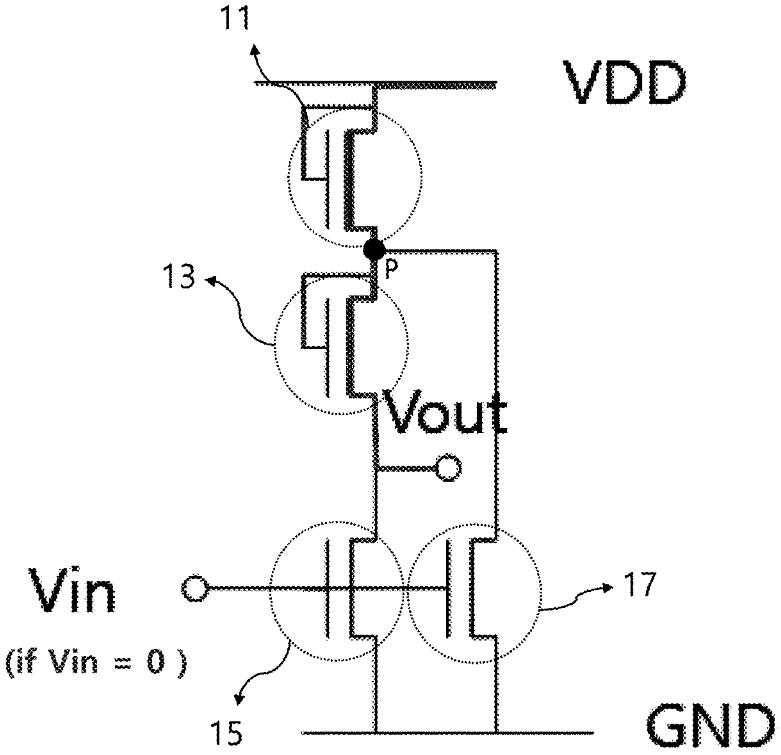
FIG. 6 is a view illustrating an operation of an input '0' and output '1' logic of the inverter in FIG. 5.

FIG. 6 is a view illustrating an operation of an input '0' and output '1' logic of the inverter in FIG. 5.

Referring to FIG. 6, in a state in which the input is 'O', the driving transistor 15 and the control transistor 17 are turned off. The output voltage is connected to the VDD through the first load transistor 11 and the second load transistor 13 that are connected in series, so that the output voltage is increased by VDD-Vth. As the output voltage increases by VDD-Vth, a state in which the output is '1' is realized.

Figure 7:
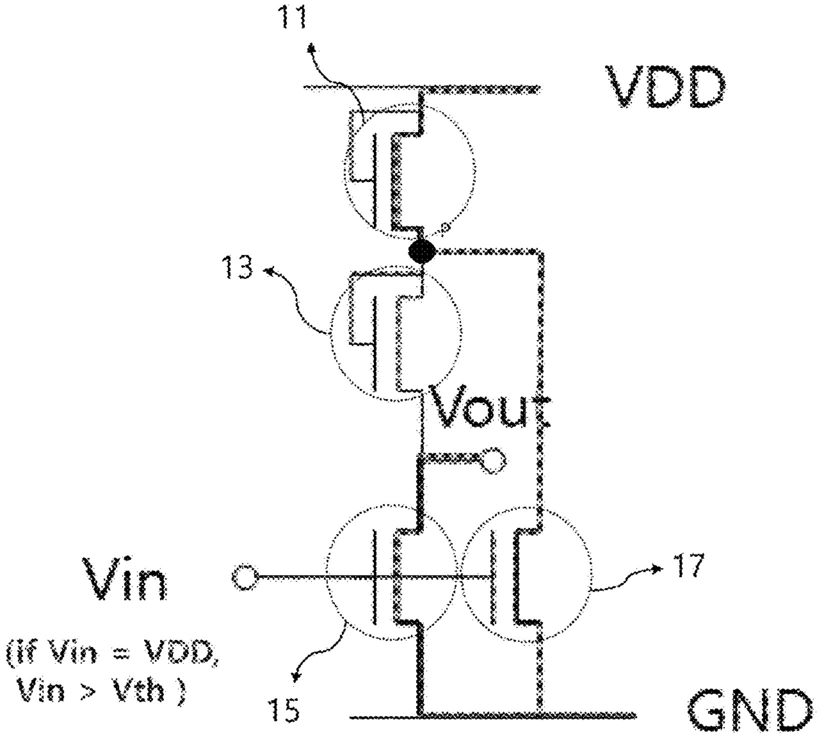
FIG. 7 is a view illustrating an operation of an input '1' and output '0' logic of the inverter in FIG. 5.

FIG. 7 is a view illustrating an operation of an input '1' and output '0' logic of the inverter in FIG. 5.

Referring to FIG. 7, in a state in which the input is '1', the driving transistor 15 and the control transistor 17 are turned on. It is preferable that a channel width of the control transistor 17 is set to be much larger than a channel width of each of the first and second load transistors 11 and 13. In the present embodiment, each resistance of the first and second load transistors 11 and 13 may be set to be much larger than a resistance of the control transistor 17. In this situation, the node (P) to which the first load transistor 11 and the second load transistor 13 are connected is connected to ground and becomes 0V. Eventually, since the drain electrode of the driving transistor 15 becomes 0V, the output voltage becomes a complete 0V.

Figure 8:
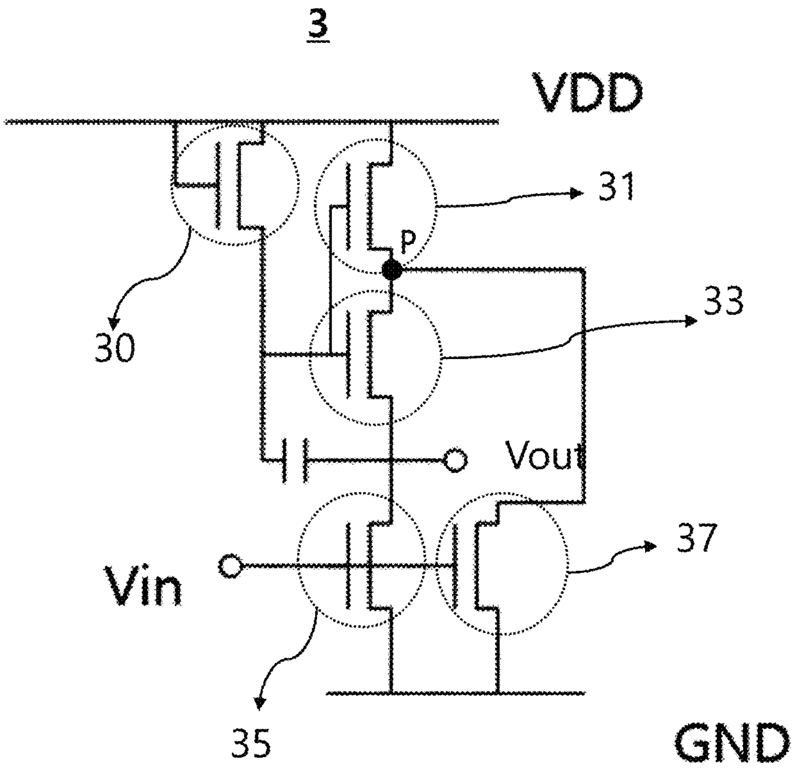
FIG. 8 is view illustrating a circuit diagram of a bootstrap inverter according to another embodiment of the present disclosure.

FIG. 8 is view illustrating a circuit diagram of a bootstrap inverter 3 according to another embodiment of the present disclosure. Referring to FIG. 8, the bootstrap inverter 3 according to the present embodiment may include: a first load transistor 31 having a gate electrode and a drain electrode connected to a power voltage (VDD) terminal; a second load transistor 33 having a drain electrode connected to a source electrode of the first load transistor 31 and having a source electrode of the second load transistor 33 connected to an output terminal; a bootstrap transistor 30 having a gate electrode and a drain electrode connected to the power voltage (VDD) terminal and having a source electrode connected to a gate electrode of the second load transistor 33; a driving transistor 35 having a drain electrode connected to the source electrode of the second load transistor 33 such that the output terminal is formed, the driving transistor 35 having a gate electrode connected to an input (Vin) terminal and having a source electrode connected to a ground (GND) terminal; and a control transistor 37 having a drain electrode connected to the source electrode of the first load transistor 31, having a gate electrode connected to the input (Vin) terminal, and having a source electrode connected to the ground (GND) terminal. In addition, the bootstrap inverter 3 may further include a capacitor having a first end connected to the source electrode of the bootstrap transistor and having a second end connected to the output terminal.

Figure 9:
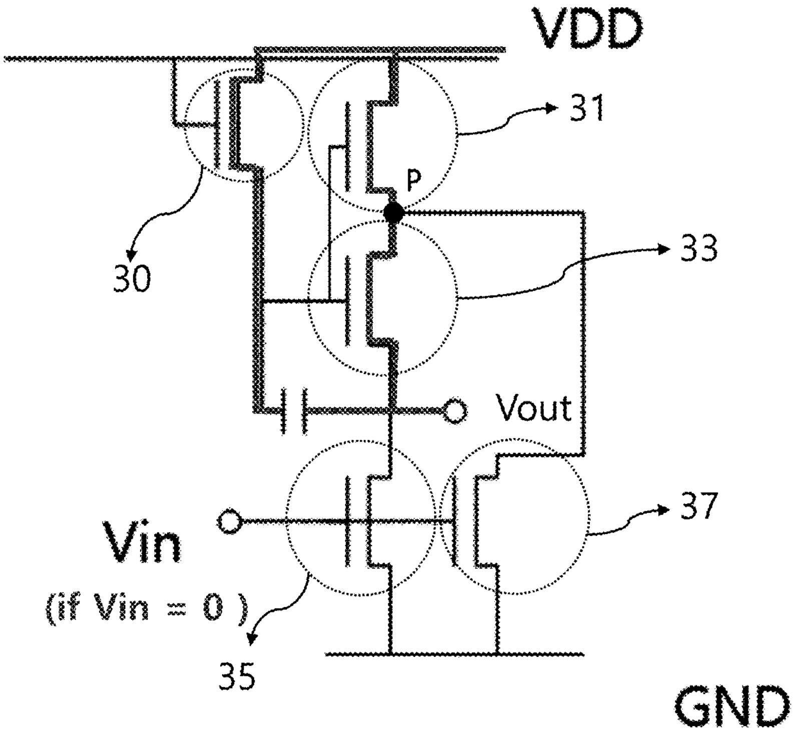
FIG. 9 is a view illustrating an operation of an input '0' and output '1' logic of the inverter in FIG. 8.

FIG. 9 is a view illustrating an operation of an input '0' and output '1' logic of the bootstrap inverter 3. Referring to FIG. 9, in a state in which the input is '0', the driving transistor 35 and the control transistor 37 are turned off. The VDD voltage is connected to the output through the first load transistor 31 and the second load transistor 33, so that the output voltage is increased. At this time, as the output voltage is increased, each gate voltage of the first and second load transistors 31 and 33 is also increased due to the bootstrap transistor 30, and the output voltage is increased to the VDD, so that a state in which the output voltage is VDD that is 'l' is realized.

Figure 10:
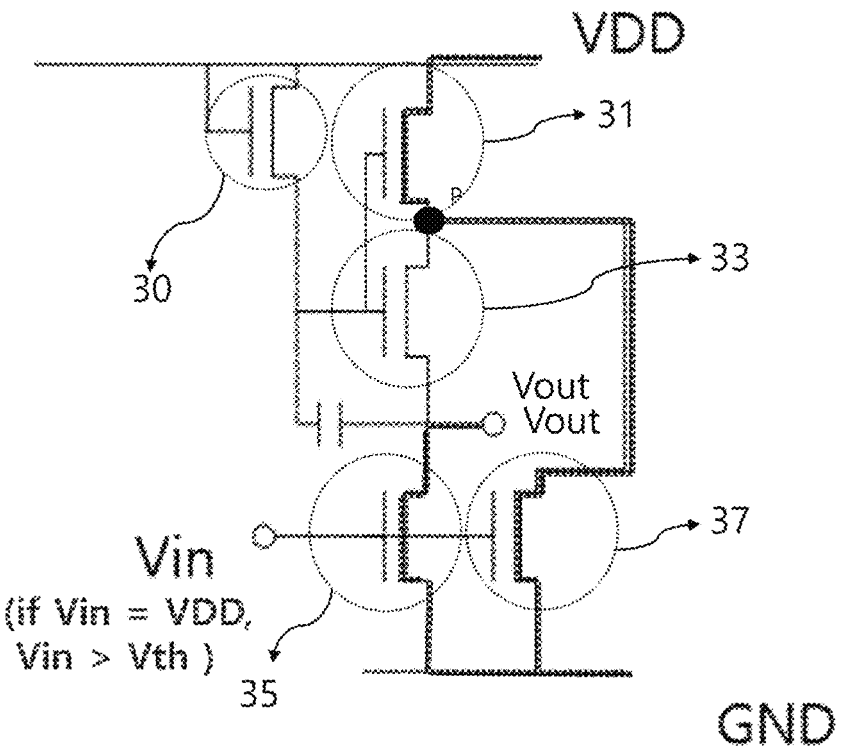
FIG. 10 is a view illustrating an operation of an input '1' and output '0' logic of the inverter in FIG. 8.

FIG. 10 is a view illustrating an operation of an input '1' and output '0' logic of the bootstrap inverter 3. Referring to FIG. 10, in a state in which the input voltage is VDD that is '1', the driving transistor 35 and the control transistor 37 are turned on. Therefore, the voltage of the node P to which the first and second load transistors 31 and 33 are connected becomes 0V, and the output voltage becomes 0V. Therefore, in the state in which the input is '1', the output voltage is 0V, and an ideal '0' logic is capable of being realized.

Although the present disclosure has been described in detail through representative embodiments, those skilled in the art to which the present disclosure belongs will understand that various modifications of the described embodiments are possible within the spirit and scope of the present disclosure. Therefore, the spirit of the present disclosure should not be limited to the described embodiments, and all things equal or equivalent to the claims as well as the claims to be described later fall within the scope of the concept of the present disclosure.

DESCRIPTION OF REFERENCE NUMERALS

1, 3: inverter
11, 31: first load transistor
13, 33: second load transistor
15, 35: driving transistor
17, 37: control transistor
30: bootstrap transistor

INDUSTRIAL APPLICABILITY

The present disclosure relates to an inverter and a bootstrap inverter, and the inverter and the bootstrap inverter having improved output characteristics may be provided by applying a circuit in which a predetermined transistor is added.

The invention claimed is:

1. An inverter comprising:

a first load transistor having a gate electrode and a drain electrode that are connected to a power voltage (VDD) terminal;

a second load transistor having a gate electrode and a drain electrode that are connected to a source electrode of the first load transistor, the second load transistor having a source electrode connected to an output terminal;

a driving transistor having a drain electrode connected to the source electrode of the second load transistor such that the output terminal is formed, the driving transistor having a gate electrode connected to an input (Vin) terminal and having a source electrode connected to a ground (GND) terminal; and a control transistor having a drain electrode connected to the source electrode of the first load transistor, having a gate electrode connected to the input (Vin) terminal, and having a source electrode connected to the ground (GND) terminal, wherein when the control transistor is turned on, the source electrode of the first load transistor is connected to the ground (GND) terminal, so that a voltage of a node (P) to which the drain electrode of the second load transistor and the source electrode of the first load transistor are connected becomes approximately 0V.

2. A bootstrap inverter comprising:

a first load transistor having a drain electrode connected to a power voltage (VDD) terminal and having a gate electrode connected to a gate electrode of a second load transistor;

the second load transistor having a drain electrode connected to a source electrode of the first load transistor and having a source electrode of the second load transistor connected to an output terminal;

a bootstrap transistor having a gate electrode and a drain electrode connected to the power voltage (VDD) terminal and having a source electrode connected to the gate electrode of the second load transistor;

a driving transistor having a drain electrode connected to the source electrode of the second load transistor such that the output terminal is formed, the driving transistor having a gate electrode connected to an input (Vin) terminal and having a source electrode connected to a ground (GND) terminal; and a control transistor having a drain electrode connected to the source electrode of the first load transistor, having a gate electrode connected to the input (Vin) terminal, and having a source electrode connected to the ground (GND) terminal.

3. The bootstrap inverter of claim 2, further comprising a capacitor having a first end connected to the source electrode of the bootstrap transistor and having a second end connected to the output terminal.

* * * * *